(12) United States Patent
Jakubowicz et al.

(10) Patent No.: US 11,411,373 B2
(45) Date of Patent: Aug. 9, 2022

(54) EX-SITU CONDITIONING OF LASER FACETS AND PASSIVATED DEVICES FORMED USING THE SAME

(71) Applicant: ll-VI Delaware, Inc., Wilmington, DE (US)

(72) Inventors: Abram Jakubowicz, Pfaeffikon (CH); Martin Sueess, Zurich (CH)

(73) Assignee: II-VI Delaware, Inc., Wilmington, DE (US)

( * ) Notice: Subject to any disclaimer, the term of this patent is extended or adjusted under 35 U.S.C. 154(b) by 11 days.

(21) Appl. No.: 16/925,415

(22) Filed: Jul. 10, 2020

(65) Prior Publication Data

US 2020/0343692 A1 Oct. 29, 2020

Related U.S. Application Data

(62) Division of application No. 15/996,614, filed on Jun. 4, 2018, now Pat. No. 10,714,900.

(51) Int. Cl.
| | |
|---|---|
| *H01S 5/22* | (2006.01) |
| *H01S 5/028* | (2006.01) |
| *H01S 5/10* | (2021.01) |
| *H01S 5/40* | (2006.01) |

(52) U.S. Cl.
CPC .......... *H01S 5/2202* (2013.01); *H01S 5/0283* (2013.01); *H01S 5/1082* (2013.01); *H01S 5/4031* (2013.01); *H01S 2301/176* (2013.01)

(58) Field of Classification Search
CPC ........ H01S 5/2202; H01S 5/0283; H01S 5/40; H01S 5/0282

USPC ........................................................ 372/45.01
See application file for complete search history.

(56) References Cited

U.S. PATENT DOCUMENTS

| | | | |
|---|---|---|---|
| 4,749,255 A | 6/1988 | Chakrabarti | |
| 5,063,173 A | 11/1991 | Gasser et al. | |
| 5,665,637 A * | 9/1997 | Chand ................... | H01S 5/0281 372/43.01 |
| 6,519,272 B1 | 2/2003 | Baliga et al. | |
| 6,538,298 B1 | 3/2003 | Weingarten | |
| 6,590,920 B1 | 7/2003 | McElhinney | |
| 6,618,409 B1 * | 9/2003 | Hu ......................... | H01L 33/44 372/43.01 |
| 6,812,152 B2 | 11/2004 | Lindstrom et al. | |
| 6,980,579 B2 | 12/2005 | Jewell | |
| 7,687,291 B2 * | 3/2010 | Charache ................ | H01S 5/028 438/33 |

(Continued)

FOREIGN PATENT DOCUMENTS

WO WO 01/84680 11/2001

*Primary Examiner* — Tuan N Nguyen
(74) *Attorney, Agent, or Firm* — Wendy W. Koba

(57) ABSTRACT

Edge-emitting laser diodes having mirror facets include passivation coatings that are conditioned using an ex-situ process to condition the insulating material used to form the passivation layer. An external energy source (laser, flash lamp, e-beam) is utilized to irradiate the material at a given dosage and for a period of time sufficient to condition the complete thickness of passivation layer. This ex-situ laser treatment is applied to the layers covering both facets of the laser diode (which may comprise both the passivation layers and the coating layers) to stabilize the entire facet overlay. Importantly, the ex-situ process can be performed while the devices are still in bar form.

10 Claims, 3 Drawing Sheets

(56) References Cited

U.S. PATENT DOCUMENTS

| | | |
|---|---|---|
| 7,763,485 B1 | 7/2010 | Dimitrov et al. |
| 8,111,727 B2 | 2/2012 | Harder et al. |
| 8,277,877 B1 * | 10/2012 | Dimitrov .............. H01S 5/1231 |
| | | 427/162 |
| 8,355,419 B2 * | 1/2013 | Shchukin .............. H01S 5/2027 |
| | | 372/45.01 |
| 2001/0017872 A1 | 8/2001 | Yamanaka |
| 2001/0048706 A1 | 12/2001 | Deichsel |
| 2006/0193360 A1 | 8/2006 | Yamanaka |
| 2008/0219313 A1 | 9/2008 | Yoshida |
| 2009/0003404 A1 | 1/2009 | Ishikawa |
| 2009/0200573 A1 | 8/2009 | Kawakami et al. |
| 2009/0257466 A1 | 10/2009 | Eberhard |
| 2017/0237230 A1 | 8/2017 | Kawaguchi et al. |
| 2017/0310077 A1 | 10/2017 | Zhang |

* cited by examiner

EX-SITU CONDITIONING OF LASER FACETS AND PASSIVATED DEVICES FORMED USING THE SAME

CROSS-REFERENCE TO RELATED APPLICATIONS

This application is a divisional of U.S. patent application Ser. No. 15/996,614, filed Jun. 4, 2018 and herein incorporated by reference.

TECHNICAL FIELD

The present invention relates to laser devices and, more particularly, to edge-emitting laser diodes having mirror facets that are conditioned using an ex-situ process.

BACKGROUND OF THE INVENTION

High power semiconductor laser diodes have become important components in the technology of optical communication, particularly because such laser diodes can be used for fiber pumping (amplification of optical signals) and other high power applications. In most cases features such as long lifetime, reliable and stable output, high output power, high electro-optic efficiency, and high beam quality are generally desirable. One key for the long-term reliability of modern high-power laser diodes depends on the stability of the laser facets cleaved to form the opposing mirrors of the laser cavity.

The physical degradation of laser facets is a complex reaction that can be driven by light, current, and heat, resulting in power degradation and, in severe cases, to catastrophic optical damage (COD) of the mirror surfaces themselves. A process developed by IBM and referred to as "E2 passivation" has been used to address these concerns and minimize the possibility of COD. As described in IBM's U.S. Pat. No. 5,063,173 entitled "Method for Mirror Passivation of Semiconductor Laser Diodes" issued to M. Gasser et al., the E2 process involves the deposition of a layer of silicon (or perhaps germanium or antimony) as a coating over the bare facet (mirror) surfaces. The presence of the coating functions as a passivation layer, preventing the diffusion of impurities capable of reacting with the mirror facet interface.

Today's laser diodes are operated at relatively high powers and these prior art passivation layers, as deposited, have been found to break down and allow for damage of the mirror surfaces to occur. Therefore, in order to obtain stable mirrors for infrared high power laser diodes, it has now become a standard practice to "condition" the passivation layer. As performed today, conditioning is an extremely time-consuming process that requires operating the laser diode at a reduced current level for a prolonged period of time (e.g., tens to hundreds of hours) so as to form a crystalline structure inside the as-deposited amorphous passivation layer, forming a stable interface between the passivation layer and the mirror facet. Besides the time period required for this conditioning process, it is necessarily performed on a device-by-device basis, further extending the time and expense of the fabrication process.

SUMMARY OF THE INVENTION

The need to reduce the time required for laser facet conditioning is addressed by the present invention, which relates to laser devices and, more particularly, edge-emitting laser diodes having mirror facet passivation coatings that are conditioned using an "ex-situ" irradiation process in place of the conventional reduced current operation approach.

In accordance with the teachings and principles of the present invention, an external energy source is utilized to irradiate the material used as the facet passivation layer. The passivation layer should preferably be insulating (or low conducting). In particular, it may be formed using materials such as silicon, germanium or antimony. The irradiation process itself takes only seconds or a few minutes, compared to the extended hours of time required for the prior art "burn-in" conditioning process.

The external energy source may comprise a laser, flash lamp, electron beam, or other suitable radiation source. The energy source may be operated in either CW or pulsed fashion, where the passivation layer is irradiated with an irradiation dose sufficient to condition the complete thickness of the layer of passivation material. This ex-situ conditioning treatment is applied to facets of the laser diode and is preferably performed while the devices are in bar form (i.e., before dicing). However, it is to be understood that the inventive ex-situ conditioning process may also be applied to individual devices after dicing, performing ex-situ conditioning of either individual unmounted dies or mounted dies (e.g., devices mounted on cards, carriers, or submounts).

An exemplary ex-situ method of passivating facets of an edge-emitting laser diode in accordance with one or more embodiments of the present invention includes the following steps: a) depositing, in a reaction chamber, one or more layers of passivation materials on bare facet surfaces of the edge-emitting laser diode to form a facet coating of a predetermined thickness; b) removing the laser diode from the reaction chamber; and, c) irradiating the facet coating with a beam from an energy source for a period of time sufficient to condition the facet coating through the predetermined thickness. In an alternative method, the outer coating layers may be deposited over the passivation layers prior to performing the irradiation step (thus fully conditioning and providing stabilization of the combination of the passivation layer and coating layer).

Another embodiment of the present invention takes the form of an edge-emitting laser diode comprising a semiconductor substrate having a waveguide structure formed thereon for generating light at an operating wavelength, a pair of cleaved facets formed on opposing faces of the waveguide structure, passivation layers of a predetermined thickness formed to cover the pair of cleaved facets, wherein the passivation layers are fully conditioned through the predetermined thickness, and a reflective coating formed directly over at least one of the passivation layers.

Other and further embodiments and aspects of the present invention will become apparent during the course of the following discussion and by reference to the accompanying drawings.

DETAILED DESCRIPTION

As will be described in detail below, the present invention is directed to the utilization of an ex-situ process to fully condition the passivation layer used as a coating on exposed facets of a laser diode. Ex-situ is used here to emphasize the difference between conditioning as formed in accordance with the principles of the present invention (i.e., conditioning provided by using an external energy source) and the prior art "in-situ" conditioning achieved by operation of the laser diode device itself (typically at a reduced current level for an extended period of time). For the purposes of the present invention, the phrase "fully condition" primarily means to condition the material comprising the passivation layer (e.g., silicon, germanium, antimony) through the complete thickness of the layer. To "fully condition" can also be described for the purposes of the present invention as providing an ex-situ stabilization of the complete facet overlay, including both the passivation layer and a standard coating layer overlying the passivation layer (as well as all interfaces therebetween, such as the passivation film-chip interface).

As will be discussed below, the ex-situ approach of the present invention allows for the conditioning to be performed on a bar of laser diodes (prior to dicing into individual devices) thus significantly improving the efficiency of the process over the prior art product-by-product approach. Additionally, the ex-situ process of the present invention takes only a matter of seconds or minutes to perform, depending on the size/area to be treated, not the hours required by the conventional device-operated conditioning approach.

Figure 1:
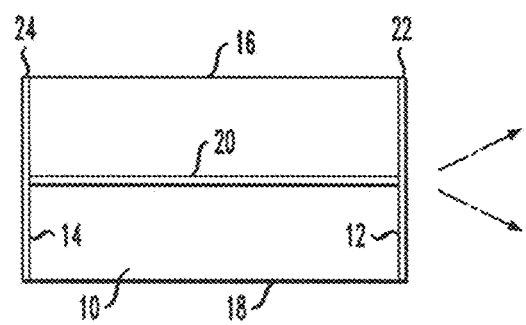
FIG. 1 is a schematic plan view of an edge-emitting semiconductor laser diode.

Turning now to the figures, an exemplary laser diode is schematically illustrated in the plan view of FIG. 1. The laser is formed in a semiconductor opto-electronic chip (or "bar") 10 having a front facet 12 and an opposing rear facet 14. Bar 10 includes a vertical structure (not shown in detail) that is typically composed of layers of AlGaAs, GaAs, and related III-V semiconductor materials epitaxially deposited on a GaAs substrate. However, it is to be understood that other material combinations are possible within the scope of the present invention.

In the commercial production of these devices, a large number of such bars are simultaneously formed on a single GaAs wafer, with the wafer then cleaved along natural cleavage planes to form a large number of separate bars 10 having the front and rear facets 12, 14, as well as the perpendicularly-arranged sides 16, 18, as shown in FIG. 1. The semiconductor processing performed on the wafer also forms a waveguide structure 20 extending between and perpendicular to facets 12, 14. While in most cases waveguide structure 20 is a ridge waveguide, other configurations are possible (e.g., a buried heterostructure waveguide, which may be preferred for high power applications). For many high power applications, waveguide structure 20 may have a width substantially larger than the lasing wavelength so as to form a broad-area laser.

As part of the fabrication process, cleaved facets 12, 14 are subjected to the conventional E2 passivation process. That is, bars 10 are loaded into a reaction chamber and passivation material(s) are deposited to a predetermined thickness to provide a coating over mirror surfaces of facets 12 and 14. The passivation materials need to be insulating (or low conducting), preferably comprising silicon, germanium, or antimony, and may also comprise any oxide or nitride of these materials. The as-deposited materials are shown as passivation layers 22, 24 in FIG. 1. It is at this point in the process that the ex-situ conditioning process of the present invention may be used.

Figure 2:
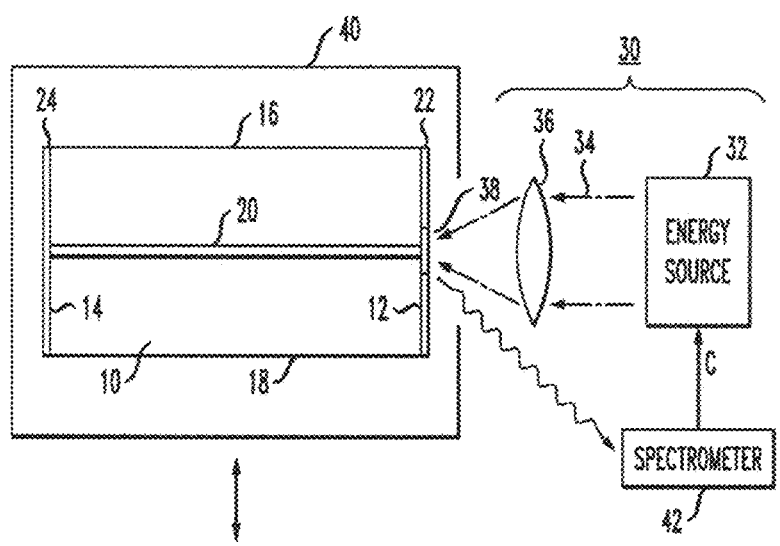
FIG. 2 shows an exemplary arrangement for performing ex-situ conditioning of laser diode passivation layers in accordance with one or more embodiments of the present invention.

In accordance with one or more embodiments of the present invention, conditioning of passivation layers 22, 24 is provided by an external system 30, as shown in FIG. 2. External system 30 includes an energy source 32 for generating a beam 34, which is typically in the visible range (e.g., 532 nm) but may also comprise a UV or IR beam. Energy source 32 may emit in either CW or pulsed mode. In the specific embodiment illustrated in FIG. 2, beam 34 from energy source 32 subsequently passes through a focusing lens 36 and scans along a portion 38 of passivation layer 22 which overlies an active region of the laser diode bar 10. Laser diode bar 10 may be mounted on a conventional sub-mount fixture 40 and moved with respect to the radiation from energy source 32 so that the focused beam is scanned across the lateral extent of passivation layer 22. Energy source 32 may comprise any radiation source capable of emitting radiation at an energy sufficient to create the desired homogeneous conditioning of the passivation material. In particular, energy source 32 may comprise a laser source, a flash lamp, an electron beam source, or any other system that creates a beam with an energy sufficient to condition passivation layer 22 through its complete thickness.

A spectrometer 42, also shown in FIG. 2, may be utilized to monitor the conditioning process. For example, scattered/redirected radiation from passivation layer 22 can be analyzed within spectrometer 42 using conventional means to determine the point in time when full conditioning has been achieved. Once the monitoring signal has leveled off, the external energy system may be de-activated.

It is to be understood that the same ex-situ radiation process can be used to fully condition passivation layer 24 along the opposite endface of the laser diode. Indeed, it is possible to configure a system where both facets are simultaneously conditioned. It has been found that the conditioning provided by this ex-situ irradiation process results in a homogeneous conditioning of the passivation materials through the complete thickness of the passivation layer. This is a clear advantage over the prior art process of activating the devices and performing the conditioning at a reduced power level, which has been found to result at times in a partial, inhomogeneous conditioning of the passivation materials.

Figure 3:
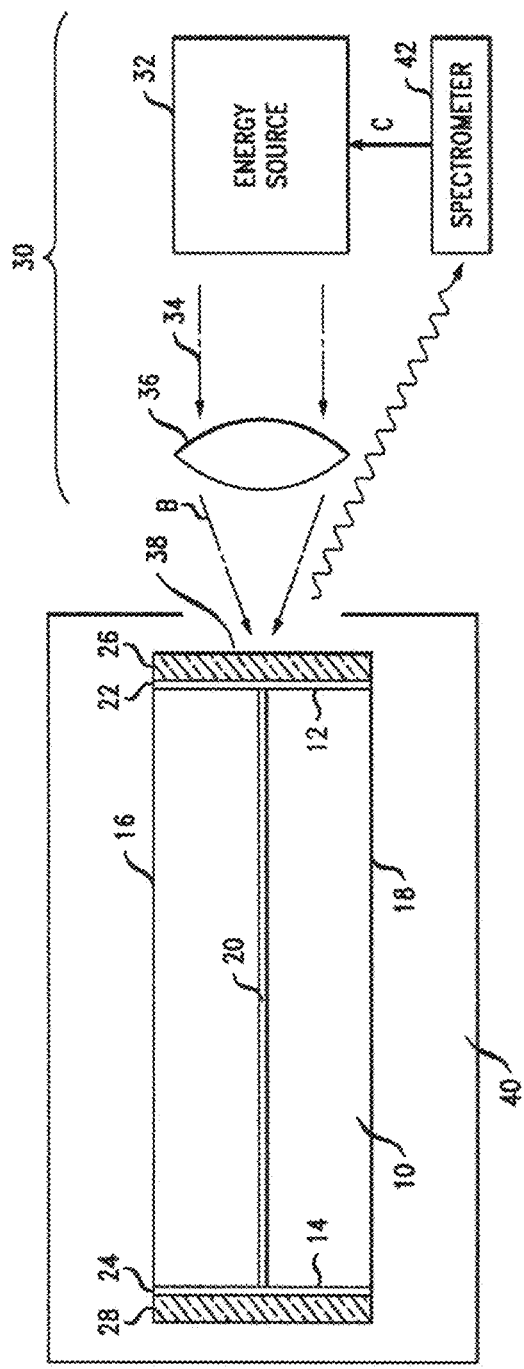
FIG. 3 shows an alternative arrangement for performing ex-situ conditioning, in this case providing full conditioning/stabilization of the passivation layers and overlying coating layers.

As mentioned above, it is also possible to perform the conditioning process of the present invention after both the passivation layers and reflective coating layers have been applied over the laser facets. FIG. 3 illustrates an exemplary laser diode, similar in structure to the configuration shown in FIG. 1, but in this case further processed to deposit a first coating layer 26 over passivation layer 22 and a second coating layer 28 over passivation layer 24. In most cases, silicon nitride is used as coating layers 26, 28. Other suitable coating materials include, but are not limited to, silicon, germanium, gallium arsenide, silicon oxide, aluminum oxide, titanium oxide, aluminum nitride, and tantalum oxide.

Similar to the embodiment of FIG. 1, energy source 30 is used to irradiate both coating layer 26 and underlying passivation layer 22 so as to fully condition and stabilize the laser diode structure. Under irradiation, the structures of both the coating and passivation layers change in a manner that stabilizes the device and results in creating the required high COD levels. For example, when silicon nitride is used as the coating material, the silicon nitride remains amorphous during irradiation (as opposed to crystallizing), but the atomic configurations in the nitride material does change. At the same time, this irradiation crystallizes the passivation layer and forms an interface between the passivation layer and the chip.

Thus, in accordance with this FIG. 3 embodiment of the present invention, the phrase "fully condition" means to structurally change the coating layer, crystallize the passivation layer, and create an interface between the laser chip and the passivation layer. The ex-situ conditioning process of the present invention can therefore be thought of as "stabilizing" the laser diode itself by virtue of the changes made to these layers.

Figure 4:
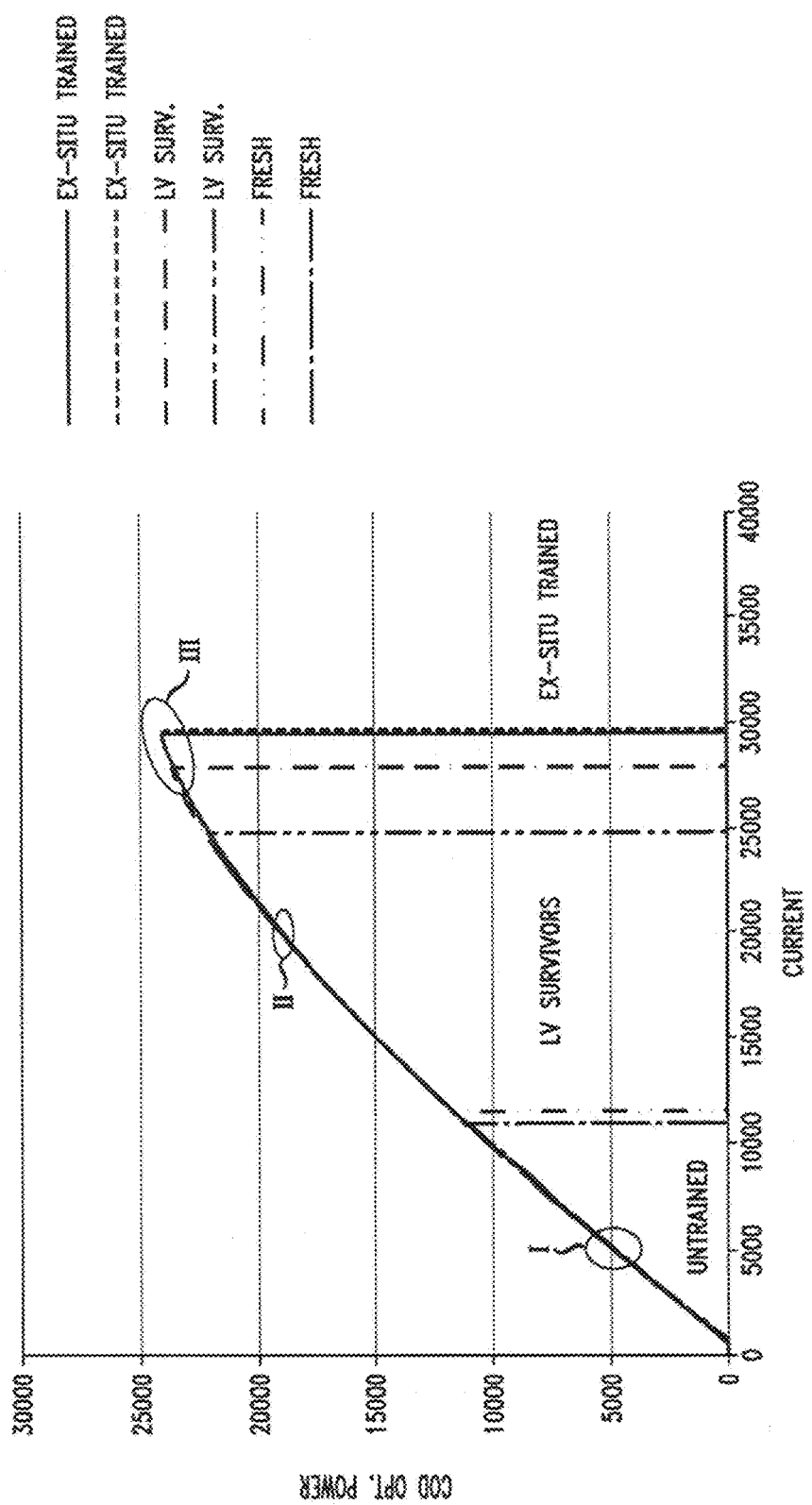
FIG. 4 contains a set of plots, showing the improvement in COD by using ex-situ conditioning in accordance with the present invention.

The COD current of devices formed in accordance with the present invention has been compared against devices using the conventional burn-in process. It is recalled that "COD current" is defined as the current at which the laser facet experiences catastrophic optical damage. FIG. 4 illustrates the results of this comparison. In particular, FIG. 4 contains a set of plots I showing the COD power as a function of current for devices that have been subjected only to the conventional E2 process (without any post-process conditioning). Plots II are associated with devices created using the same prior art E2 process, followed by the conventional "in-situ" conditioning process of operating the devices at low current/power levels. Clearly, the performance of these conditioned devices exceeds those in the first group, with much higher COD levels. Plots III are associated with devices formed in accordance with the present invention; that is, using an ex-situ conditioning process to provide full conditioning of the passivation layers. In particular, the results shown in FIG. 4 were obtained from devices formed in accordance with the embodiment discussed above in association with FIG. 3, where the ex-situ conditioning process was formed to stabilize both the coating and passivation layers.

It is observed that the devices formed in accordance with the present invention exhibit a somewhat higher level of COD than those of the prior art. While this is clearly one goal of the present invention, the fact that full conditioning can be performed on the complete laser bar (instead of at the individual device level) is also significant and a great improvement over the prior art. Moreover, the inventive ex-situ condition process is orders of magnitude more efficient than the standard burn-in process, able to fully condition/stabilize the structure in a matter of seconds or minutes, in comparison to the tens to hundreds of hours required for low-current level burn-in.

Summarizing, the process of the present invention has been found to homogeneously and fully condition the standard E2 passivation layer (as well as the overlying coating layer when present), eliminating the vertical and lateral conditioning inhomogeneity as found in the prior art. The inventive process is found to maximize the current level at which mirror damage occurs (i.e., the COD current/optical power) without burn-in. This eliminates the prior art's need to perform chip training by chip operation. The distribution of COD current within a production lot has also been found to be reduced.

Moreover, as mentioned above, it is possible to perform ex-situ full conditioning of laser facets at the bar level (i.e., before chip separation). This allows for the full conditioning of a large number of bars in a short period of time, as preferred for mass production situations. Indeed, the inventive approach also eliminates the need for a customer to perform any conditioning steps on the devices, as was the case in certain situations in the past.

It is to be understood that the principles of the present invention may be embodied in other specific forms without departing from its spirit or essential characteristics. The described embodiments are to be considered in all respects as only illustrative, not restrictive. The scope of the invention, therefore, is indicated by the appended claims rather than by the foregoing description. All changes that come within the meaning and range of equivalency of the claims are to be embraced within their scope.

What is claimed is:

1. An edge-emitting laser diode comprising
a semiconductor substrate having a waveguide structure formed thereon for generating light at an operating wavelength;
a pair of cleaved facets formed on opposing faces of the waveguide structure;
a pair of irradiated passivation layers, each irradiated passivation layer comprising a homogenous material selected from the group consisting of: silicon, germanium, antimony, as well as oxides and nitrides thereof, with each irradiated passivation layer formed to exhibit a predetermined thickness and disposed to cover an associated cleaved facet of the pair of cleaved facets, each irradiated passivation layer exhibiting a homogeneous structure through the predetermined thickness thereof, providing a pair of conditioned, irradiated passivation layers; and
a reflective coating layer formed directly over at least one conditioned, irradiated passivation layer of the pair of irradiated passivation layers.

2. The edge-emitting laser diode as defined in claim 1 wherein the reflective coating layer is an irradiated reflective coating layer.

3. The edge-emitting laser diode as defined in claim 1 wherein the reflective coating layer is formed of a material selected from the group consisting of: silicon, germanium, gallium arsenide, silicon oxide, silicon nitride, aluminum oxide, titanium oxide, aluminum nitride and tantalum oxide.

4. The edge-emitting laser diode as defined in claim 1 wherein the waveguide structure comprises a ridge waveguide configuration.

5. The edge-emitting laser diode as defined in claim 1 wherein the waveguide structure comprises a buried heterostructure configuration.

6. A laser diode bar comprising
a semiconductor substrate having a waveguide structure formed thereon, the waveguide structure extending across a width sufficient to allow for the laser diode bar structure to be thereafter diced into individual edge-emitting laser diode devices;
a pair of cleaved facets formed on opposing faces of the laser diode bar structure;
a pair of irradiated passivation layers, each irradiated passivation layer comprising a homogenous material selected from the group consisting of: silicon, germanium, antimony, as well as oxides and nitrides thereof, with each irradiated passivation layer formed to exhibit a predetermined thickness and disposed to cover an associated cleaved facet of the pair of cleaved facets, each irradiated passivation layer exhibiting a homogeneous structure through the predetermined thickness thereof, providing a pair of conditioned, irradiated passivation layers; and a reflective coating layer formed directly over at least one conditioned, irradiated passivation layer of the pair of irradiated passivation layers.

7. The laser diode bar as defined in claim 6 wherein the reflective coating layer is an irradiated reflective coating layer.

8. The laser diode bar as defined in claim 6 wherein the reflective coating layer is formed of a material selected from the group consisting of: silicon, germanium, gallium arsenide, silicon oxide, silicon nitride, aluminum oxide, titanium oxide, aluminum nitride and tantalum oxide.

9. The laser diode bar as defined in claim 6 wherein the waveguide structure comprises a ridge waveguide configuration.

10. The laser diode bar as defined in claim 6 wherein the waveguide structure comprises a buried heterostructure configuration.

* * * * *